United States Patent
Chakraborty et al.

(10) Patent No.: US 10,366,005 B2
(45) Date of Patent: Jul. 30, 2019

(54) MEMORY INTERLEAVE SYSTEM AND METHOD THEREFOR

(71) Applicant: FREESCALE SEMICONDUCTOR, INC., Austin, TX (US)

(72) Inventors: Arup Chakraborty, Austin, TX (US); Mazyar Razzaz, Austin, TX (US); James A. Welker, Austin, TX (US)

(73) Assignee: NXP USA, INC., Austin, TX (US)

( * ) Notice: Subject to any disclaimer, the term of this patent is extended or adjusted under 35 U.S.C. 154(b) by 393 days.

(21) Appl. No.: 15/160,345

(22) Filed: May 20, 2016

(65) Prior Publication Data

US 2017/0336973 A1 Nov. 23, 2017

(51) Int. Cl.
| G06F 12/00 | (2006.01) |
| G06F 12/06 | (2006.01) |
| G11C 7/10 | (2006.01) |
| G11C 11/409 | (2006.01) |
| G11C 11/406 | (2006.01) |

(52) U.S. Cl.
CPC ........ *G06F 12/0607* (2013.01); *G11C 7/1042* (2013.01); *G11C 11/409* (2013.01); *G11C 11/40618* (2013.01)

(58) Field of Classification Search
CPC .............. G06F 12/0607; G11C 7/1042; G11C 11/40618; G11C 11/409
See application file for complete search history.

(56) References Cited

U.S. PATENT DOCUMENTS

| 5,761,695 A * | 6/1998 | Maeda ................ G06F 12/0607 711/5 |
| 7,181,591 B2 | 2/2007 | Tsai |
| 2005/0060482 A1 | 3/2005 | Ishikawa |

* cited by examiner

*Primary Examiner* — Matthew Bradley

(57) ABSTRACT

Methods and systems for accessing a memory are provided. One method of accessing a memory includes generating a memory access profile for accesses to a memory array. A memory controller coupled to the memory array is configured using the generated memory access profile. After configuring the memory controller, accesses to the memory array are interleaved based on the memory access profile.

19 Claims, 4 Drawing Sheets

MEMORY INTERLEAVE SYSTEM AND METHOD THEREFOR

BACKGROUND

Field

This disclosure relates generally to memories, and more specifically, to a system and method for memory interleaving.

Related Art

Memories usually consume a significant portion of die area in a semiconductor device. As semiconductor process technology advances, integrated circuit feature sizes (e.g. transistor gate length) continue to decrease. With smaller feature sizes, higher performing and larger memories can be implemented in a semiconductor device. One challenge with implementing higher performing memories is that memory controllers may not keep up with capabilities of the higher performing memories. Accordingly, improved memory controllers may be required to utilize the bandwidth capabilities of the higher performing memories.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, methods and systems for accessing a memory. Interleaving is a well-known technique for spreading accesses to a memory more evenly by alternating accesses to sections of the memory to improve performance. Monitoring accesses to a memory allow for determination and generation of a memory access profile. After a memory access profile is generated, it can be used in configuring a memory controller to provide a more bandwidth efficient and lower latency interleaving scheme. Because the interleaving scheme is based on a generated memory access profile for accesses to a memory array, the steps to configure the interleaving scheme can be repeated for various applications and use cases of processing system, for example.

Figure 1:
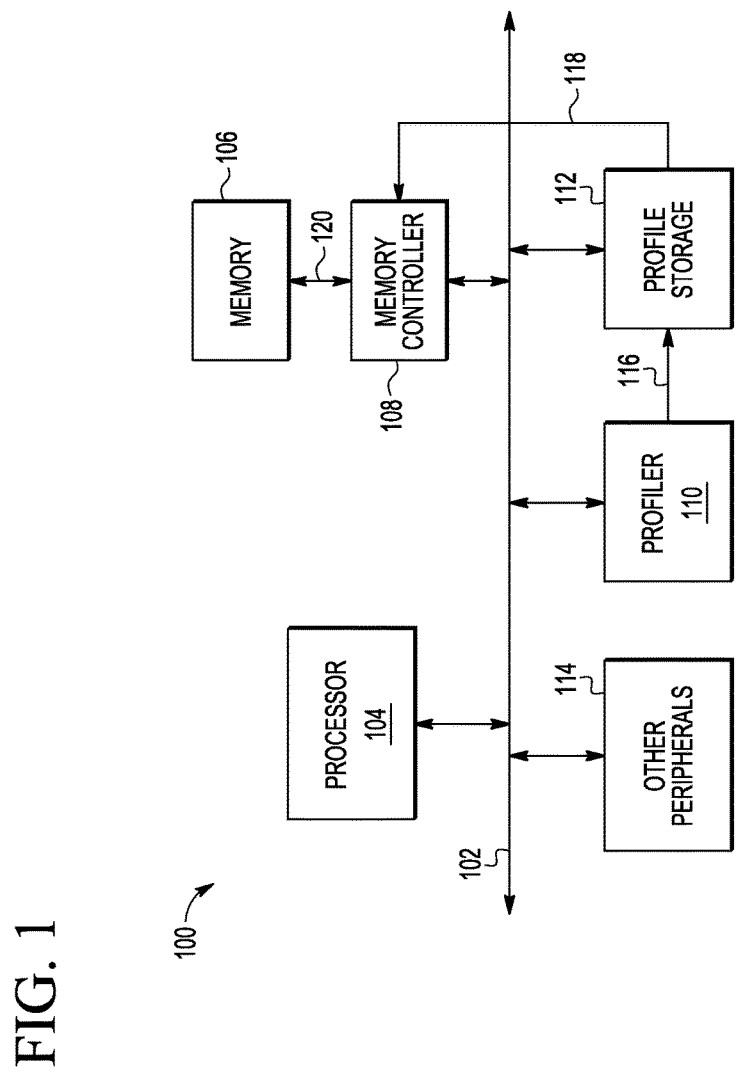
FIG. 1 illustrates, in simplified block diagram form, a processing in accordance with an embodiment of the present disclosure.

FIG. 1 illustrates, in simplified block diagram form, a processing system 100 in accordance with an embodiment of the present disclosure. Processing system 100 includes a system bus 102, processor 104, memory array 106, memory controller 108, profiler 110, profile storage 112, and other peripherals 114. Processor 104, memory controller 108, profiler 110, profile storage 112, and other peripherals 114 are bidirectionally coupled to the system bus 102 by way of respective buses. System bus 102 can be any type of bus for communicating any type of information such as data, address, instructions, and control. Processing system 100 is typically includes a plurality of integrated circuits, having memory array 106 on a semiconductor die separate from that of the processor 104, for example. In some embodiments, processing system 100 may be formed on a single semiconductor die and characterized as a system-on-a-chip (SoC).

Processor 104 may be any type of processor, including circuits for processing, computing, etc., such as a microprocessor (MPU), microcontroller (MCU), digital signal processor (DSP), or other type of processing core. Processing system 100 may include multiple processors like processor 104. Memory array 106 may include any type of volatile or non-volatile memory array cells, such as dynamic random access memory (DRAM), static random access memory (SRAM), flash, etc. Memory controller 108 is bidirectionally coupled to memory array 106 via memory bus 120. Memory controller 108 includes circuitry configured for controlling accesses to memory array 106 including operations such as read/write, program/erase, precharge, refresh, and the like, while providing appropriate access timings. Memory bus 120 includes signals for conveying control information to perform such operations, along with data and addressing associated with accesses to memory array 106.

Profiler 110 includes circuitry for monitoring memory accesses to memory array 106 and determining a memory access profile. For example, the profiler 110 may monitor system bus 102 while an application is being executed in processing system 100 and determine a memory access profile based on the rate at which each address bit toggles for accesses to memory array 106. Because the memory controller 108 is coupled to the memory array 106, the memory access profile may be based on the rate at which each address bit toggles for accesses which are received by the memory controller 108.

Memory access profiles as determined by the profiler 110 are stored in profile storage 112. Profile storage 112 may include any type of volatile or non-volatile memory capable of storing one or more determined memory access profiles. Memory access profile information signals 116 are transferred from profiler 110 to profile storage 112. Profile control information signals 118 provide stored memory access profile information to the memory controller 108.

In turn, memory controller 108 uses profile control information signals 118 to configure a corresponding memory interleaving scheme. The interleaving scheme may include a remapping of address bits such that higher rate toggling address bits are mapped to select sections of memory which incur lower latencies when accessing memory array 106. For example, memory controller 108 may be configured to provide an interleaving scheme such that a highest rate toggling address bit is mapped to select channel sections of memory array 106, where consecutive accesses to different channel sections have the lowest latencies. In some embodiments, memory controller 108 includes an interleaver circuit configured to interleave accesses to memory array 106 based on memory access profile information.

Other peripherals 114 of processing system 100 may include any number of other circuits and functional hardware blocks such as processors, timers, counters, communications, interfaces, analog-to-digital converters, digital-to-analog converters, PLLs, I/Os, and the like for example.

Figure 2:
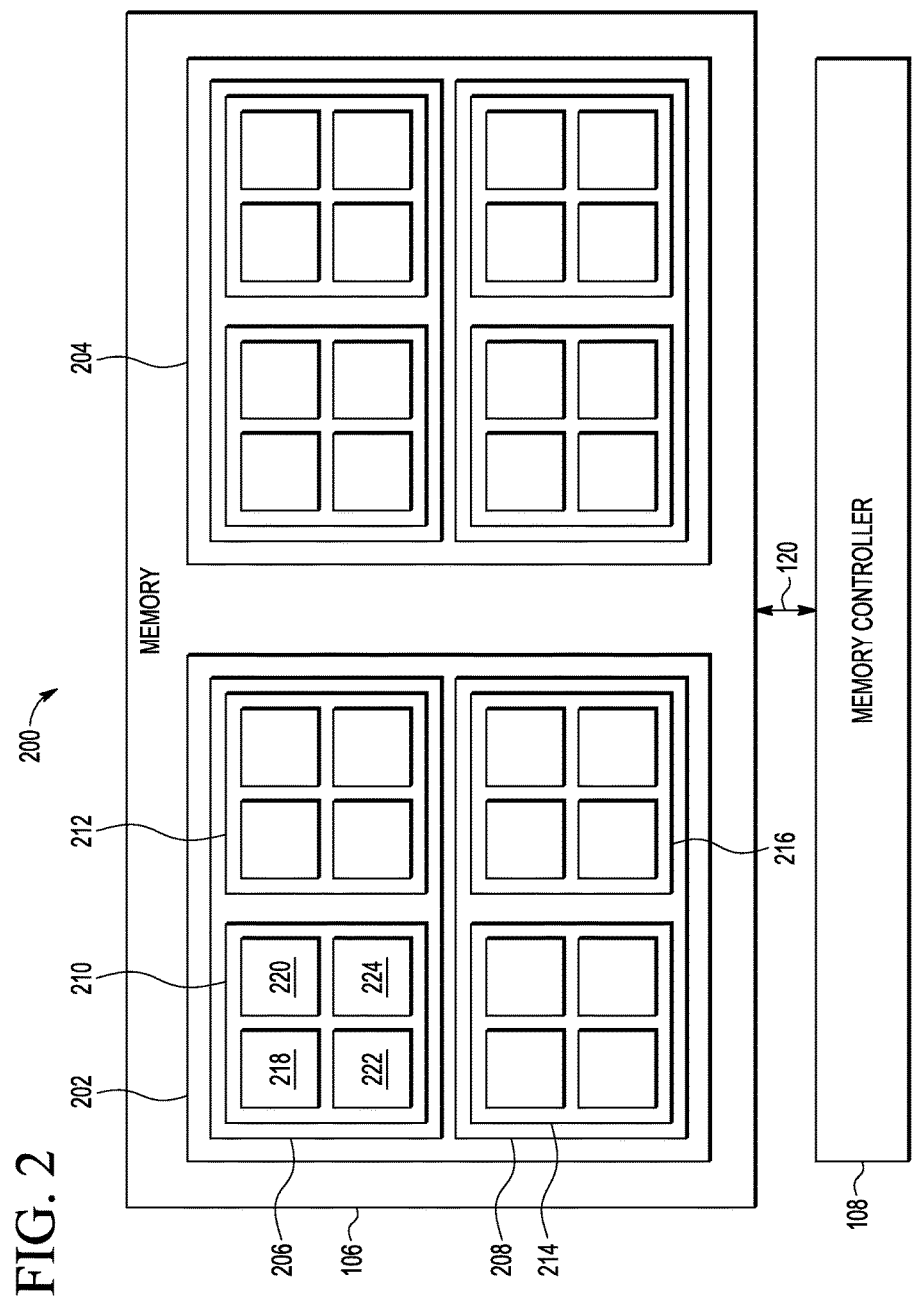
FIG. 2 illustrates, in simplified block diagram form, exemplary memory organization in accordance with an embodiment of the present disclosure.

FIG. 2 illustrates, in simplified block diagram form, memory system 200 in accordance with an embodiment of the present disclosure. Memory system 200 includes memory array 106 coupled to memory controller 108 via bus 120. Memory array 106 is arranged in an exemplary hierarchical organization including logical partitions such as channels, ranks, banks, and pages. By way of example, the organization of memory array 106 is described in the following detail.

A first channel 202 includes first and second ranks 206 and 208. First rank 206 include first and second banks 210 and 212, and second rank 208 includes third and fourth banks 214 and 216. The first bank includes pages 218-224. Similarly, second, third, and fourth banks 212-216 each include four pages. Likewise, a second channel 204 is organized in a hierarchical manner similar to the first channel 202. In some embodiments, memory array 106 may be characterized as a DRAM array including the exemplary hierarchical organization described above. In some embodiments, memory array 106 may be organized in any number of channels, ranks, banks, and pages. In some embodiments, memory array 106 may include other hierarchical partitions such as bank groups comprised of multiple banks, for example.

Figure 3:
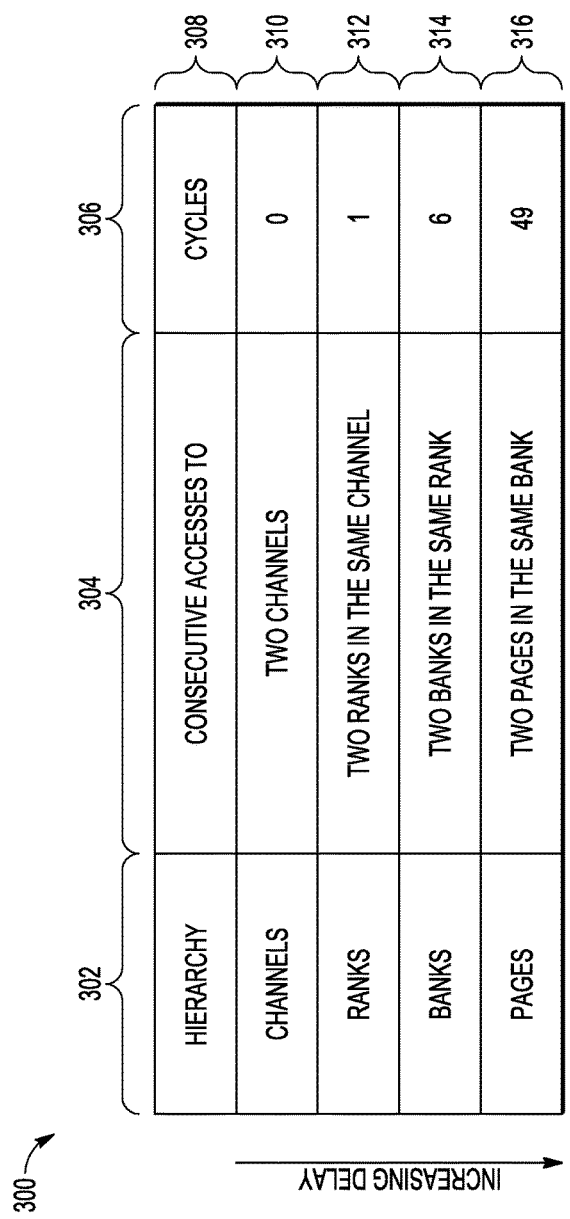
FIG. 3 illustrates, in tabular form, simplified memory access latencies in accordance with an embodiment of the present disclosure.

FIG. 3 illustrates, in tabular form, simplified memory access latencies in accordance with an embodiment of the present disclosure. When performing consecutive accesses to different hierarchical sections of memory, additional cycles of delay may be incurred. These additional delay or latency cycles may be referred to as penalty cycles. Shown in table 300 are typical penalty cycles for example consecutive accesses to hierarchical partitions of memory array 106 as organized in FIG. 2. The first row 308 of the table 300 includes column headings Hierarchy (302), Consecutive Accesses To (304), and Cycles (306). Column 302 includes hierarchical partitions labeled as channels, ranks, banks, and pages arranged in an increasing access penalty delay order. Column 304 includes a brief description of an example consecutive access scenario corresponding to each listed hierarchical partition. Column 306 includes a typical number of penalty cycles corresponding to each example consecutive access scenario assuming DDR3 memory arrangement.

By way of example, consider a DRAM array as organized in FIG. 2 depicting DDR3 memory operating at 2133 MHz. Accesses to memory array 106 may include typical timing delays or latencies for given hierarchical accesses. At the channel hierarchy shown in row 310, consecutive accesses to any two different channels may have a zero penalty cycle impact. At the rank hierarchy shown in row 312, consecutive accesses to any two ranks in the same channel may include a one penalty cycle impact. At the bank hierarchy shown in row 314, consecutive accesses to any two banks in the same rank may include six penalty cycles of impact. At the page hierarchy shown in row 316, consecutive accesses to any two pages in the same bank may include 49 penalty cycles of impact. Accordingly, accesses to different portions of memory array 106 may incur non-uniform latencies based on locations of the accesses within hierarchical partitions.

Figure 4:
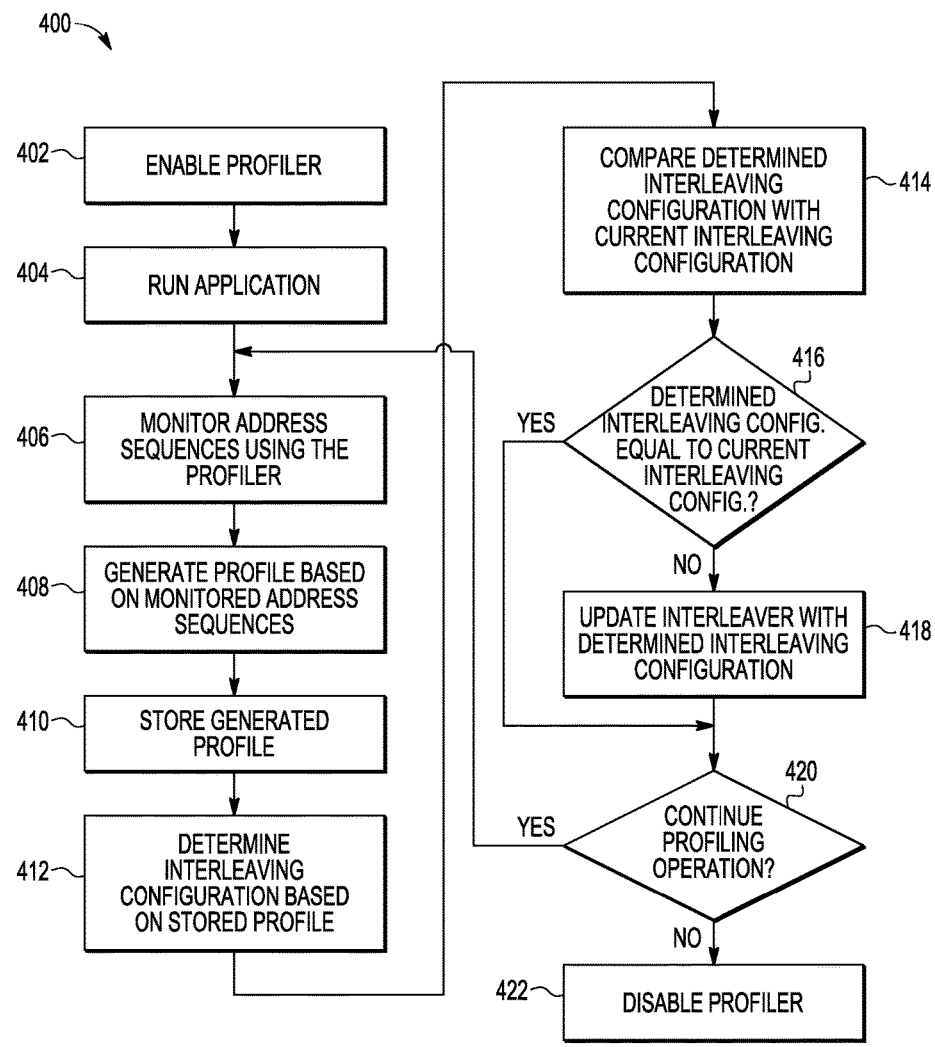
FIG. 4 illustrates, in simplified flow chart diagram form, a method of accessing a memory in accordance with an embodiment of the present disclosure.

FIG. 4 illustrates, in simplified flow chart diagram form, an exemplary method 400 of accessing a memory in accordance with an embodiment of the present disclosure.

At step 402, enable profiler 110 to begin a profiling operation. Profiler 110 is enabled to monitor accesses to memory array 106 and to determine memory access profiles. For example, the profiler 110 may be coupled to system bus 102 for monitoring accesses to memory array 106. In some embodiments, memory array 106 may be coupled directly to processor 104 by way of a direct bus, having profiler 110 coupled to the direct bus to monitor accesses to memory array 106.

At step 404, run an application with processing system 100. An application may be executed with processor 104, other peripherals 114, or a combination of processor 104 and other peripherals 114 having accesses to memory array 106. The application may include one or more use cases. A use case may typically include a set of operations to perform one or more tasks which exercise features of processing system 100, for example.

At step 406, monitor address sequences of accesses to memory array 106 using profiler 110. Monitoring may be performed using software or existing hardware such as performance monitors and trace units included in the processing system 100. Monitoring address sequences may include measuring the rate at which address bits toggle. The rate at which address bits toggle may range from a lowest toggling rate to a highest toggling rate, having various toggling rates in between. For example, a toggling rate for addresses monitored may be measured in percentages, such as a toggling rate of 100% for an address bit which toggles for each and every access to memory array 106, and a toggling rate of 0% for an address bit which remains constant for each and every access to the memory array 106. Accordingly, an address bit may have toggling rates between 0% and 100%. Alternatively, toggling rates may be measured in frequencies based on the processing system 100 bus speeds, memory access speeds, and the like such that a highest toggling frequency for addresses monitored may be in the GHz range while the lowest toggling rate may be in the KHz range, for example.

At step 408, generate memory access profile based on monitored address sequences. The profiler 110 determines a memory access profile using monitored address information such as address sequences, address toggling rates and frequencies, and the like. For example, a determined or generated memory access profile may include the rate at which each address bit toggles for access to memory array 106. The memory access profile may include monitored address information from accesses to memory array 106 during a particular application, operation, use case, and the like.

At step 410, store generated memory access profile in profile storage 112. Profile storage 112 can be any suitable storage such as register file, volatile or non-volatile memory, counters, flip-flops, and the like. Profile storage 112 is coupled to memory controller 108.

At step 412, determine an interleaving configuration based on stored profile. The memory controller 108 is coupled to receive memory access profile information stored in profile storage 112. The received memory access profile information is used by the memory controller 108 to configure an interleaving scheme for accesses to memory array 106. For example, a memory access profile may include address bits toggling at a various rates. Accordingly, a determined interleaving configuration based on latencies shown in FIG. 3 may include remapping higher toggling address bits such that the highest toggling rate address bit (or bits) selects channels, a second highest toggling rate address bit (or bits) selects ranks, a third highest toggling rate address bit (or bits) selects banks, and the lowest toggling rate address bit (or bits) selects pages. Configuring an interleaving scheme as such can balance overall accesses to the memory array 106, improving performance by reducing the overall latencies and/or increasing memory bandwidth associated with accesses to the memory array 106.

At step 414, compare determined interleaving configuration with current interleaving configuration. The current interleaving configuration may be characterized as a currently employed, active, or default interleaving configuration, while the determined interleaving configuration may be characterized as a new or updated interleaving configuration. The determined interleaving configuration is compared with the current interleaving configuration for determining at step 416 whether the determined interleaving configuration is substantially equal to or similar to the current interleaving configuration. If the determined interleaving configuration is substantially equal to the current interleaving configuration (YES), then the current interleaving configuration does not need to be updated or replaced with the determined interleaving configuration, and the flow continues at step 420. If the determined interleaving configuration is not substantially equal to the current interleaving configuration (NO), then the memory controller 108 is updated with the determined interleaving configuration at step 418. In some embodiments, processing system 100 and/or memory controller 108 may need to be restarted or reset to allow the determined interleaving configuration to be used. After updating the memory controller 108 with the determined interleaving configuration, flow continues at step 420 interleaving accesses with the updated interleaving configuration.

At step 420, determine whether to continue the profiling operation. Any number of scenarios may be considered when determining whether to continue profiling. For example, with some applications, the pattern of memory accesses may be repetitive and require only one iteration through the profiling sequence of steps. On the other hand, some applications may have an unpredictable pattern of memory accesses, and depend upon external inputs such as network traffic, requiring several iterations through the profiling sequence of steps. In some cases, heuristics may be used such as whether a memory access profile has changed since last N seconds or since last M iterations, for example, to determine whether to continue profiling. Accordingly, if it is determined to continue the profiling operation (YES), then the flow continues at step 406. If it is determined to discontinue the profiling operation (NO), then the profiler 110 is disabled at step 422 and the profiling operation ends.

Generally, there is provided, a method of accessing a memory including generating a memory access profile for accesses to a memory array; using the memory access profile to configure a memory controller coupled to the memory array; and after configuring the memory controller, interleaving accesses to the memory array based on the memory access profile. The method may further include storing the memory access profile in a profile storage memory. The profile storage memory may include a non-volatile memory (NVM) array. The memory array may include a dynamic random access memory (DRAM) array. The DRAM array may be partitioned into at least a bank, a rank, and a channel. Generating a memory access profile may include determining the rate at which address bits toggle. The memory controller may be configured to select a DRAM bank based on the memory access profile. Using the memory access profile to configure a memory controller may further include determining an interleaving scheme based on the memory access profile. Configuring the memory controller may further include configuring the memory controller to control an interleaver to interleave access to the memory.

In another embodiment, there is provided, a memory system, including a memory array; a profiler coupled to determine a rate at which address bits toggle for accesses to the memory array; and a memory controller coupled to the memory array, the memory controller configured to interleave accesses to the memory array based on the determined rate at which address bits toggle for accesses to the memory array. The memory system may further include a memory access profile corresponding to the determined rate at which address bits toggle for accesses to the memory array. The memory system may further include a profile storage memory coupled to the profiler, profile storage memory to store the memory access profile. The memory array may include a dynamic random access memory (DRAM) array. The DRAM array may be partitioned into at least a bank, a rank, and a channel. The memory controller may be configured to select a DRAM bank based on the memory access profile.

In yet another embodiment, there is provided, a method of accessing a memory, including generating a memory access profile for accesses to a memory array; using the memory access profile to configure a memory controller coupled to the memory array, the memory controller including an interleaver; and after configuring the memory controller, using the interleaver to interleave accesses to the memory based on the memory access profile. The method may further include storing the memory access profile in a profile storage memory before using the memory access profile to configure a memory controller. Generating a memory access profile may include determining the rate at which address bits toggle. The memory array may include a first dynamic random access memory (DRAM) array and a second DRAM array, the first DRAM array associated with a first channel and the second DRAM array associated with a second channel. The interleaver to interleave accesses may further include selecting the first channel or the second channel based on the memory access profile.

By now it should be appreciated that there has been provided, methods and systems for accessing a memory. Monitored accesses to a memory included in a processing system allow for determination and generation of a memory access profile. The memory access profile can be used in configuring a memory controller to provide a more latency and bandwidth efficient interleaving scheme. Because the interleaving scheme is based on a determined memory access profile for accesses to a memory array, the steps to configure the interleaving scheme can be repeated for various applications and use cases of the processing system.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of accessing a memory, comprising:
   monitoring address sequences of accesses to a memory array;
   in response to the monitoring, generating a memory access profile for the accesses to the memory array based on the monitored address sequences;
   using the memory access profile to configure a memory controller coupled to the memory array, wherein using the memory access profile to configure the memory controller further comprises determining an interleaving configuration based on the memory access profile;
   comparing performance of the determined interleaving configuration with performance of a current interleaving configuration;
   updating the current interleaving configuration with the determined interleaving configuration if the determined interleaving configuration provides a more bandwidth efficient and a lower latency interleaving scheme based on a threshold associated with heuristics, wherein the heuristics include whether the memory access profile has changed since a pre-defined period or a pre-defined number of memory array access iterations; and
   after configuring the memory controller, interleaving the accesses to the memory array based on the memory access profile.

2. The method of claim 1, further comprising storing the memory access profile in a profile storage memory.

3. The method of claim 2, wherein the profile storage memory comprises a non-volatile memory (NVM) array.

4. The method of claim 1, wherein the memory array comprises a dynamic random access memory (DRAM) array.

5. The method of claim 4, wherein the DRAM array is partitioned into at least a bank, a rank, and a channel.

6. The method of claim 5, wherein generating the memory access profile comprises determining a rate at which address bits toggle.

7. The method of claim 6, wherein the memory controller is configured to select a DRAM bank based on the memory access profile.

8. The method of claim 1, wherein using the memory access profile to configure the memory controller further comprises determining an interleaving scheme based on the memory access profile.

9. The method of claim 1, wherein configuring the memory controller further comprises configuring the memory controller to control an interleaver to interleave the accesses to the memory array.

10. A memory system, comprising:
    a memory array;
    a profiler coupled to monitor address sequences of accesses to the memory array to determine a memory access profile based on a rate at which address bits toggle for the accesses to the memory array; and a memory controller coupled to the memory array, the memory controller configured to determine an interleaving configuration based on the memory access profile, to compare performance of the determined interleaving configuration with performance of a current interleaving configuration, to update the current interleaving configuration with the determined interleaving configuration if the determined interleaving configuration provides a more bandwidth efficient and lower latency interleaving scheme based on a threshold associated with heuristics, wherein the heuristics include whether the memory access profile has changes since a pre-defined period or a pre-defined number of memory access iterations, and to interleave the accesses to the memory array based on the memory access profile.

11. The memory system of claim 10, further comprising a profile storage memory coupled to the profiler, the profile storage memory to store the memory access profile.

12. The memory system of claim 10, wherein the memory array comprises a dynamic random access memory (DRAM) array.

13. The memory system of claim 12, wherein the DRAM array is partitioned into at least a bank, a rank, and a channel.

14. The memory system of claim 13, wherein the memory controller is configured to select a DRAM bank based on the memory access profile.

15. A method of accessing a memory, comprising:
monitoring address sequences of accesses to a memory array;
in response to the monitoring, generating a memory access profile for the accesses to the memory array based on the monitored address sequences;
using the memory access profile to configure a memory controller coupled to the memory array, the memory controller including an interleaver, wherein using the memory access profile to configure the memory controller further comprises determining an interleaving configuration based on the memory access profile;
comparing performance of the determined interleaving configuration with performance of a current interleaving configuration;
updating the current interleaving configuration with the determined interleaving configuration if the determined interleaving configuration provides a more bandwidth efficient and lower latency interleaving scheme based on a threshold associated with heuristics, wherein the heuristics include whether the memory access profile has changed since a pre-defined period or a pre-defined number of memory access iterations; and
after configuring the memory controller, using the interleaver to interleave the accesses to the memory array based on the memory access profile.

16. The method of claim 15, further comprising storing the memory access profile in a profile storage memory before using the memory access profile to configure the memory controller.

17. The method of claim 15, wherein generating the memory access profile comprises determining a rate at which address bits toggle.

18. The method of claim 15, wherein the memory array comprises a first dynamic random access memory (DRAM) array and a second DRAM array, the first DRAM array associated with a first channel and the second DRAM array associated with a second channel.

19. The method of claim 18, wherein using the interleaver to interleave the accesses further comprises selecting the first channel or the second channel based on the memory access profile.

\* \* \* \* \*